United States Patent
Sumikawa et al.

(10) Patent No.: US 7,692,312 B2
(45) Date of Patent: Apr. 6, 2010

(54) SEMICONDUCTOR DEVICE HAVING REINFORCEMENT MEMBER AND METHOD OF MANUFACTURING THE SAME

(75) Inventors: Masato Sumikawa, Kashihara (JP); Kazumi Tanaka, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 329 days.

(21) Appl. No.: 11/477,928

(22) Filed: Jun. 30, 2006

(65) Prior Publication Data

US 2006/0249853 A1 Nov. 9, 2006

Related U.S. Application Data

(63) Continuation of application No. 09/782,180, filed on Feb. 14, 2001, now abandoned.

(30) Foreign Application Priority Data

Feb. 14, 2000 (JP) .............................. 2000-034855

(51) Int. Cl.
H01L 23/48 (2006.01)
H01L 23/52 (2006.01)
H01L 29/40 (2006.01)

(52) U.S. Cl. ...................... 257/778; 257/731; 257/782; 257/E23.021; 438/108

(58) Field of Classification Search ................ 257/778, 257/773, 782, 783, 786, 730, 734, 737, 780, 257/E21.239, E21.237, 731, 733, 738, E23.021; 438/108, 612–613

See application file for complete search history.

(56) References Cited

U.S. PATENT DOCUMENTS

| | | | |
|---|---|---|---|
| 5,155,068 A | 10/1992 | Tada | |
| 5,703,755 A | 12/1997 | Flesher et al. | |
| 6,051,877 A | 4/2000 | Usami et al. | |
| 6,136,668 A | 10/2000 | Tamaki et al. | |
| 6,150,194 A | 11/2000 | Sakaguchi et al. | |
| 6,153,448 A | 11/2000 | Takahashi et al. | |
| 6,184,064 B1 | 2/2001 | Jiang et al. | |
| 6,242,799 B1 | 6/2001 | Horiuchi et al. | |
| 6,271,588 B1 * | 8/2001 | Ohuchi | 257/734 |
| 6,308,938 B1 | 10/2001 | Futakuchi | |
| 6,337,257 B1 * | 1/2002 | Toyosawa | 438/459 |
| 6,982,192 B1 * | 1/2006 | Vodrahalli et al. | 438/122 |
| 2003/0159644 A1 * | 8/2003 | Yonehara et al. | 117/8 |

FOREIGN PATENT DOCUMENTS

| | | |
|---|---|---|
| DE | 4435120 A1 | 4/1996 |
| DE | 197 40 055 A1 | 3/1999 |
| DE | 198 13 525 A1 | 4/1999 |
| DE | 19931240 A1 | 1/2001 |
| EP | 0637839 B1 | 2/1995 |
| JP | 59-036923 | 2/1984 |
| JP | 2000-124162 A | 4/2000 |
| WO | WO 99/26287 | 5/1999 |

\* cited by examiner

*Primary Examiner*—Davienne Monbleau
*Assistant Examiner*—Dilinh P Nguyen
(74) *Attorney, Agent, or Firm*—Birch, Stewart, Kolasch & Birch, LLP

(57) ABSTRACT

A semiconductor package providing with a printed circuit board and a semiconductor device, including a semiconductor substrate having a surface provided with an external connection electrode and mounted on the printed circuit board, and, a surface opposite that with said external connection electrode, abrased with a mirror finish and reinforced with a back-surface reinforcement.

18 Claims, 3 Drawing Sheets

SEMICONDUCTOR DEVICE HAVING REINFORCEMENT MEMBER AND METHOD OF MANUFACTURING THE SAME

CROSS REFERENCE

This application is a Continuation of application Ser. No. 09/782,180, filed on Feb. 14, 2001 now abandoned. The present application claims priority to Japanese Patent Application No. 2000-034855, filed Feb. 14, 2000, the entire contents of which are hereby incorporated by reference.

BACKGROUND OF THE INVENTION

1. Field of the Invention

The present invention relates generally to semiconductor devices and particularly to semiconductor devices that can be packaged with enhanced anti-bendability.

2. Description of the Background Art

In recent years, semiconductor devices have been further reduced in size and further increased in density to meet a demand for smaller and lighter mobile phones, mobile information equipment and other similar electronics and electronic equipment. To meet this demand there has been proposed bare-chip packaging, a technique applied in mounting an LSI chip directly on a printed circuit board.

Reference will now be made to FIGS. 5A and 5B to describe bare-chip packaging. As a bare chip, an LSI chip 7 has thereon an electrode on which ball-bonding is for example employed to provide a metal bump 14 thereon to serve as an external connection electrode. With reference to FIG. 5A, with metal bump 14 aligned with an electrode 10 provided on a printed circuit board 9 to be packaged, LSI chip 7 is packaged on printed circuit board 9 facedown. FIG. 5B shows a complete packaging.

The market for mobile equipment such as mobile phones and PHSs has significantly expanded. As such, technological innovation has been promoted therefor and bare-chip packaging has thus been increasingly adopted. Conventionally, a package is impaired in reliability generally when temperature cycle causes thermal stress and thermal distortion resulting in defects. In addition, mobile equipment carried by a user can disadvantageously bend when it receives external force. Furthermore, disadvantageous bending stress can instantly occur when mobile equipment is dropped. Furthermore, in a process for manufacturing such mobile equipment, bending stress can occur in a printed circuit board while components are packaged. As such, it is also an important condition that mobile equipment have a mechanically reliable structure impervious to bending stress and the like.

Herein, the semiconductor device shown in FIGS. 5A and 5B has main components with their respective Young's moduli, as follows:

LSI chip (Si): approximately 12 to $14 \times 10^{10}$ N/m$^2$

Printed circuit board: approximately 0.5 to $2.5 \times 10^{10}$ N/m$^2$ and it can be understood that LSI chip 7 is formed of a material hard to bend as compared with the printed circuit board. As such, when force is exerted on printed circuit board 9 to bend it, LSI chip 7 does not accordingly bends. Thus, stress concentrates at a solder connection connecting printed circuit board 9 and LSI chip 7 together and when the limit of the stress has been reached the solder connection disadvantageously breaks and thus disconnects.

The present invention therefore contemplates a semiconductor device capable of alleviating such a disadvantage as described above when the entirety of a printed circuit board receives force exerted to bend it, and a method of manufacturing the same.

SUMMARY OF THE INVENTION

To achieve the above object the present invention can provide a semiconductor device including a semiconductor substrate having a surface provided with an external connection electrode and a surface opposite that with the external connection electrode, abrased and reinforced with a back-surface reinforcement member. As such, the semiconductor substrate can be abrased and thus reduced in thickness to bend in response while a level of rigidity can be ensured as the semiconductor substrate is reinforced with the back-surface reinforcement member.

In the present invention preferably the back-surface reinforcement member is formed of resin. Since resin has a low elastic modulus it can reinforce the semiconductor substrate without affecting the bendability of the semiconductor device.

In the present invention still preferably the resin is formed of a material having an elastic modulus of $1.5 \times 10^6$ N/m$^2$ to $5.0 \times 10^6$ N/m$^2$. More specifically, the resin is selected from the group consisting of resin of rubber type, resin of silicone type, resin of epoxy type, resin of polyimide type and resin of urethane type. Thus, the resin can reinforce the semiconductor substrate without impairing the bendability of the substrate. Applying such resins can also prevent the substrate from chipping or being scratched.

The present invention provides a method of manufacturing a semiconductor device including the steps of: abrasing a surface of a semiconductor substrate opposite to that of the semiconductor substrate provided with an external connection electrode, and applying resin on the abrased surface of the semiconductor substrate. As such, the semiconductor device can be reduced in thickness to bend in response. As the semiconductor substrate is reinforced with resin, the semiconductor device can be produced with a level of rigidity ensured.

In the present invention preferably the method further includes the step of cutting the semiconductor substrate after the step of applying. As such, the present method can be readily applied in mass-production.

In the present invention still preferably the method further includes the step of grinding the surface of the semiconductor substrate to be abrased. As such, the semiconductor substrate can be processed in a reduced time.

In the present invention, preferably, in the step of applying, the resin is printed. As such, highly viscous resin can also be distributed and thus applied.

Furthermore, in the present invention, preferably, in the step of applying, the resin is applied by spin-coating. Thus the resin can be applied rapidly, reduced in thickness, uniformly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 3A:
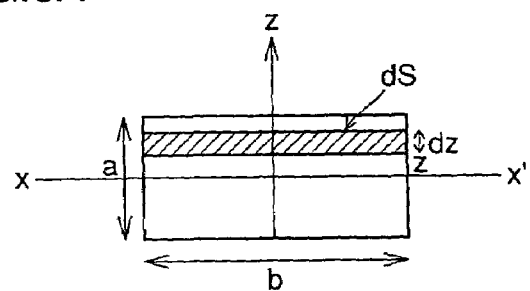
FIG. 3A is a view for illustrating a model in the form of a rectangular parallelepiped employed for considering stress occurring when an LSI chip is bent and FIG. 3B illustrates the model that is bent.
Figure 3B:
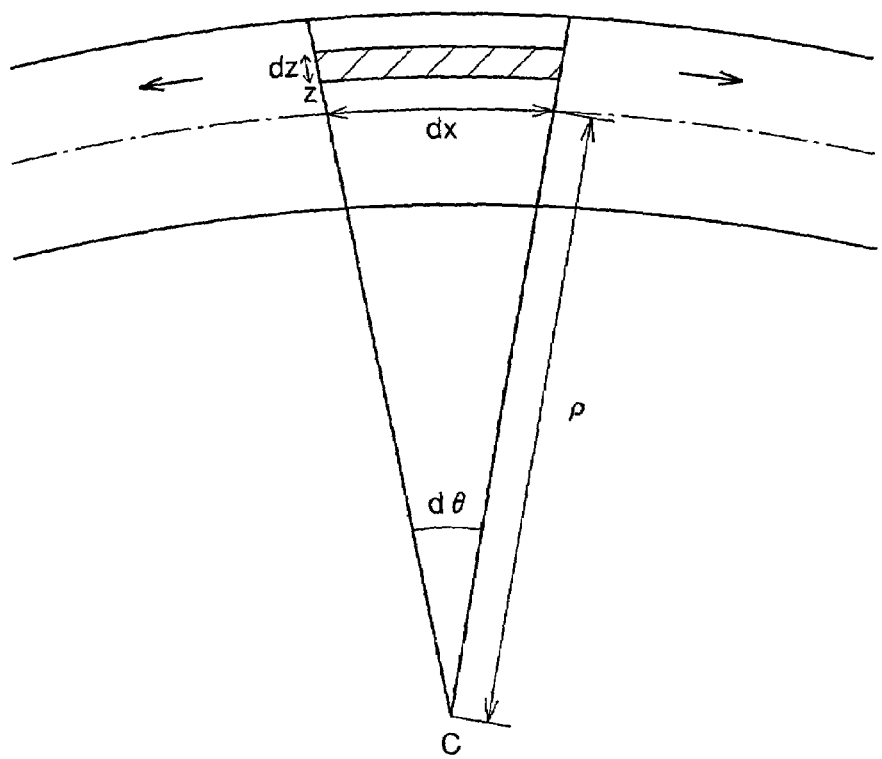

FIG. 3A shows a model in the form of a rectangular parallelepiped having a thickness a and a width b, as seen in cross section, applied to consider how LSI chip 7 bends. When this model is bent as shown in FIG. 3B, its upper side as seen in the figure expands due to tensility, its lower side as seen in the figure contracts due to pressure, and intermediate therebetween exists a neutral layer which neither expands nor contracts. Assuming that on average the model's expansion and contraction are balanced, the neutral layer includes the barycenter of the cross section. If the neutral layer has a small portion dx forming an angle dθ with respect to a center of curvature C and having a radius of curvature ρ then a thin layer dz spaced from the neutral layer by a distance z and having an area dS, which is equal to bdz, in cross section has an expansion rate of:

$$[(\rho+z)d\theta - \rho d\theta]/\rho d\theta = z/\rho \quad (1).$$

As such, this layer experiences a tensility dT of E(z/ρ)dS. If a stick neither expands nor contracts on average, its upper half as seen in cross section experiences tensility and its lower half as seen in cross section experiences pressure. If this model has a Young's modulus E then for the entirety of the cross section a bending moment is given in the following expression:

$$M = \int z dT = \frac{E}{\rho} \int_S z^2 dS = \frac{E}{\rho} \int_{-a/2}^{a/2} bz^2 dz = \frac{E}{\rho} \cdot \frac{a^3 b}{12}. \quad (2)$$

Figure 4:
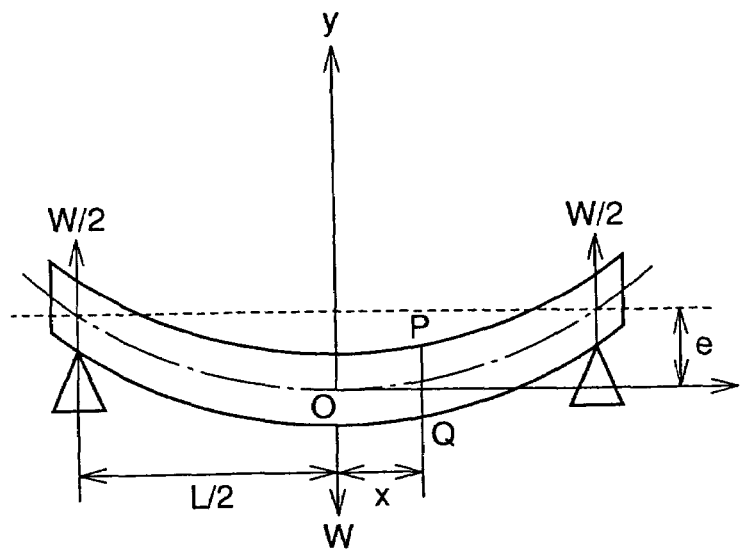
FIG. 4 is a view of the FIG. 3A model provided for considering an amount by which the center of the model descends when the model is bent.
Figure 5A:
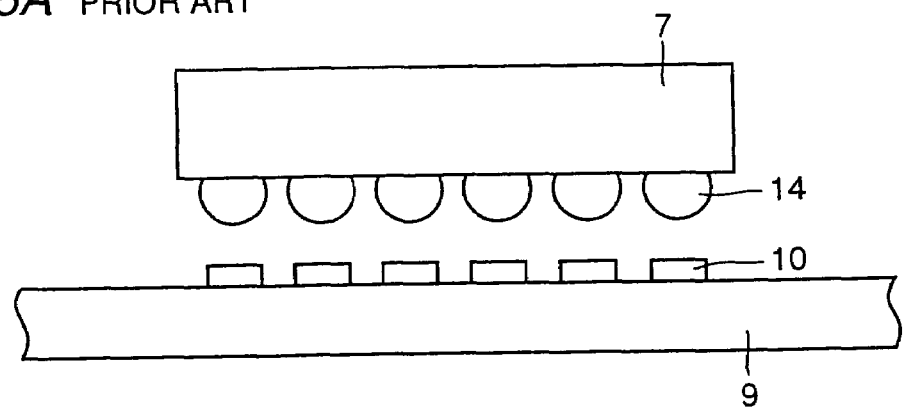
FIG. 5A illustrates a procedure of bare-chip mounting in prior art and FIG. 5B is a cross section of a completed bare-chip package.
Figure 5B:
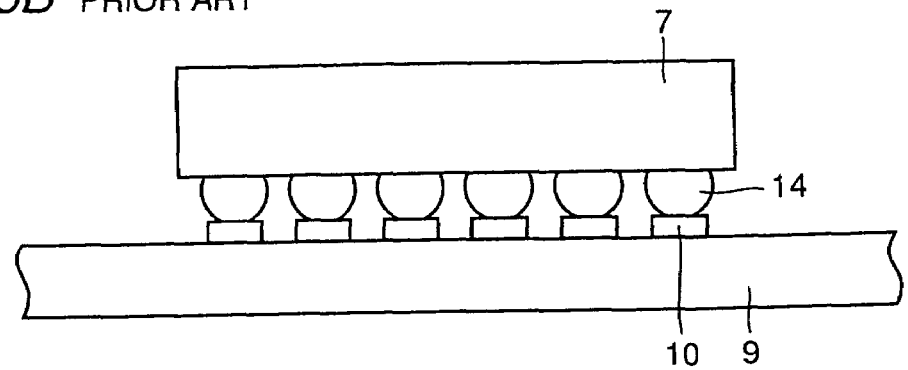

Accordingly, as shown in FIG. 4, let us assume that this model is supported at two points spaced by a length L and also has its center with a weight having a mass m (W=mg) suspended therefrom.

Symmetry allows each supporting point to exert a supporting reaction force W/2 upward. If balance in moment about an axis perpendicular to the plane of the figure is considered for a portion extending from a plane PQ, which is spaced from the model's center O by a distance x larger than 0, to a supporting point, then for plane PQ bending moment M is given by an expression (2) and, with supporting reaction force W/2 contributing to (L/2−x)·W/2, there can be obtained an expression (3):

$$\frac{E}{\rho} \frac{a^3 b}{12} = \left(\frac{L}{2} - x\right) \frac{W}{2}. \quad (3)$$

From this expression, radius of curvature ρ is obtained as a function of x. In general, a curve y=f(x) has a curvature represented by $\rho^{-1} = y''/\{1+(y')^2\}^{3/2}$. Assuming that |y'|<<1, if its terms of higher than the first degree can be neglected, then $$y'' = \frac{6W}{Ea^3 b}\left(\frac{L}{2} - x\right) \quad (4)$$

is obtained. Herein, if y=0 and y'=0 are applied for x=0 then an expression (5) is obtained, as follows:

$$y = \frac{6W}{Ea^3 b}\left(\frac{Lx^2}{4} - \frac{x^3}{6}\right). \quad (5)$$

If the center descends by an amount e then y=e for x=L/2. Therefore, from expression (5), Young's modulus E is obtained, as represented by an expression (6):

$$E = \frac{WL^3}{4ea^3 b}. \quad (6)$$

This is transformed to obtain amount e, as represented by an expression (7):

$$e = \frac{WL^3}{4Ea^3 b}. \quad (7)$$

It can be understood that amount e is in inverse proportion to the cube of thickness a of LSI chip 7. More specifically, if LSI chip 7 has large thickness a it is less flexible, which increases the possibility that when printed circuit board 9 is bent the chip cannot bend accordingly.

As such, in order for the entirety of a package to bend in response, reducing LSI chip 7 in thickness can be effective.

Initially, reference will be made to FIG. 1E to describe a structure of a semiconductor device in the present embodiment. A single wafer 1 is used to provide a plurality of LSI chips 7. Each LSI chip has a circuit side 2 formed thereon and having a surface (a lower surface, as seen in FIG. 1E) provided with a solder ball 6 serving as an external connection electrode. Substrate 1 has a back surface, opposite to the surface with the external connection electrode, with resin 5 applied thereon.

Reference will now be made to FIGS. 1A-1E to describe a method of manufacturing a semiconductor device in the present embodiment.

Figure 1A:
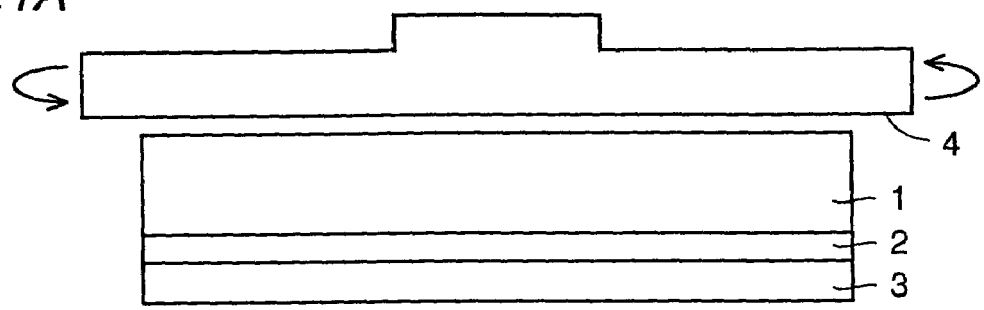
FIGS. 1A-1E are cross sections each showing a step of a process for manufacturing a semiconductor device in a first embodiment of the present invention.

FIG. 1A shows a cross section of wafer 1 used to produce a plurality of semiconductor chips. Wafer 1 has circuit side 2 thereon provided with an electrode formed for example of aluminum. Circuit side 2 also has a wiring pattern completed to allow its surface to be later provided with solder ball 6 serving as an external connection electrode and arranged in matrix.

As shown in FIG. 1A, a protection tape 3 is stuck on a surface of circuit side 2 of wafer 1 (hereinafter referred to as the back surface of wafer 1) in abrasing a side opposite that having circuit side 2. Then, as shown in FIG. 1A, wafer 1 is set on an abrasor 4 to have its back surface abrased.

Typically in producing a semiconductor device an ingot is cut to have a wafer thickness and then abrased with a wafer lapper. This wafer lapper may be used to abrase the back surface of wafer 1, since the wafer lapper can abrase a large number of wafers simultaneously and thus contribute to high productivity. The wafer is set on a turntable and an abrasive liquid containing an abrasive is used to mirror-finish the wafer.

Note that the wafer may be ground before it is abrased. If it is roughly ground the whole process time can be reduced. It should be noted, however, that after it is ground it must be abrased and thus mirror-finished, since grinding wafer 1 often results in the wafer having its processed surface with small scratches and wafer 1 thus reduced in thickness may crack at such scratches when the wafer experiences force exerted to bend it.

The thickness of wafer 1 to be provided by abrasing the wafer depends on the size of wafer 1, although for example a thickness reduced to be as small as approximately 50 µm is sufficient to be in effect impervious to bending.

Figure 1B:
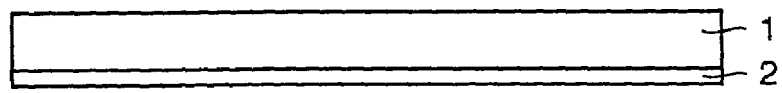

Then, as shown in FIG. 1B, abrased wafer 1 is removed from abrasor 4 and surface protecting tape 3 is removed from the wafer.

Figure 1C:
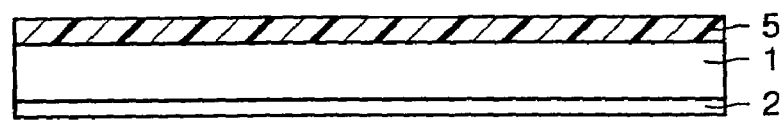

With reference to FIG. 1C, resin 5 is applied on the back surface of wafer 1 to serve as a member reinforcing the back surface of the wafer. In doing so, the wafer is printed or spin-coated with the resin. One of the techniques is employed to correspond to the resin to be used. For example, a highly viscous resin would be appropriately applied if it is printed, since if the resin is applied by a spinner it may not be distributed satisfactorily. Initially, a mask is prepared. Initially, a mask is designed to allow resin to be applied only on a wafer. The resin is only required to have a thickness on the order of several tens µm. As such, the resin is applied on a mask prepared to be as thick as targeted and thereon a squeegee is scanned to print the resin.

In contrast, if less viscous resin is used, spin-coating would be faster in applying the resin in reduced thickness and uniformly. Wafer 1 is placed on a spinner and an appropriate amount of resin is then supplied thereon. Then the spinner is turned to cause centrifugal force to distribute and thus apply the resin on the wafer.

Figure 1D:
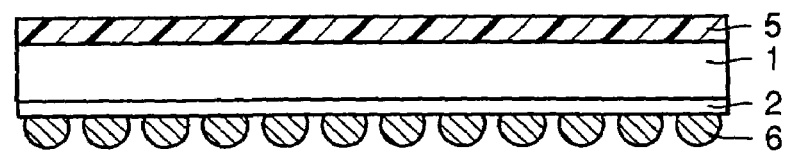
Figure 1E:
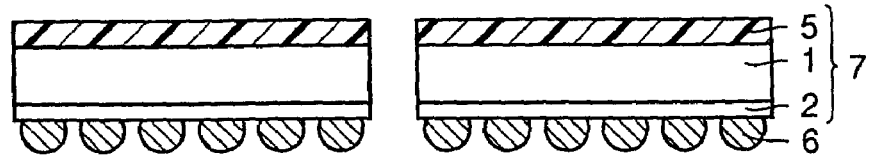

Then, with reference to FIG. 1D, solder ball 6 is provided to serve as an external connection electrode. In this step, a ball mainly formed for example of tin/lead eutectic alloy is placed together with flux and an electrode is formed by reflowing. The external connection electrode is not limited to solder ball 6 and it may be an electrode in a different form. In forming the electrode in the different form it may for example be plated and thus grown.

Finally, with reference to FIG. 1E, wafer 1 is cut along a dicing line to provide individual semiconductor chips 7. Thus as a semiconductor device completes semiconductor chip 7 with solder ball 6 connected thereto. Although FIG. 1E shows only two individual semiconductor chips cut apart, this cutting step in effect provides a large number of semiconductor chips cut apart from each other.

Note that while in the above exemplary method the abrasing step is provided after the formation of a wiring pattern for circuit side 2, this abrasing step may be provided for example before or during the formation of circuit side 2.

Furthermore, the abrasing step can be eliminated if any pre-process is used to previously prepare wafer 1 of approximately several tens µm in thickness.

The present invention can provide a semiconductor device wherein semiconductor chip 7 has a surface provided with an external connection electrode and a surface opposite that with the external connection electrode, abrased to reduce semiconductor chip 7 in thickness to allow semiconductor chip 7 itself to flex in response to bending-force. When a substrate with semiconductor chip 7 packaged receives force and thus bends, together with the substrate the chip can accordingly bend to alleviate stress in solder ball 6 or a solder connection so as to prevent the solder connection from breaking. Furthermore, resin having a low elastic modulus (a low Young's modulus) can be applied on the abrased surface of semiconductor chip 7 to reinforce the chip without having any effect on the bendability of the chip configured as above. Resin 5 can protect semiconductor chip 7 to eliminate the risk of semiconductor chip 7 chipping or being scratched and thus cracking. As such, semiconductor chip 7 can be more readily handled and thus enhanced in mechanical reliability.

Preferably, resin 5 is of material having a small elastic modulus of approximately 1.5 to $5.0 \times 10^6$ N/m$^2$ since resin 5 with such a small elastic modulus does not impair the bendability of LSI chip 7. Such a value of elastic modulus is small relative to that of LSI chip 7 and it is thus a negligible value for the entirety of a package, and applying resin 5 on LSI chip 7 can prevent the chip from chipping or being scratched, to allow the chip to be handled more readily. Resin 5 is applied in an amount that can be set as desired in a range that does not affect on the bendability of the entire package. Desirably, resin 5 is reduced in thickness in a range that can prevent LSI chip 7 from chipping or being scratched, to approximately several tens µm as the package can be decreased in thickness and its material cost can also be reduced.

Specifically, resin 5 having the above elastic modulus can be resin of rubber type, silicone type, epoxy type, polyimide type or urethane type.

Furthermore the present invention can provide a method of manufacturing a semiconductor device wherein after the initial half of a wafer process is completed and before a wafer is diced the wafer can be abrased and thereon resin can be applied to produce a large number of packages simultaneously in a single process.

Second Embodiment

Figure 2:
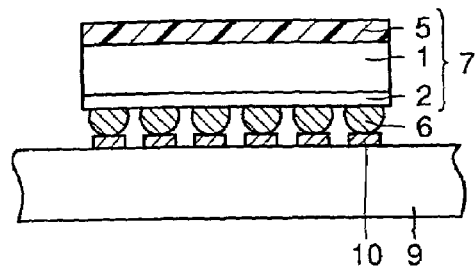
FIG. 2 is a cross section of a semiconductor device in a second embodiment of the present invention.

The present embodiment shows by way of example the FIG. 1E semiconductor chip 7 bare-chip packaged on printed circuit board 9. As a result, such a structure as shown in FIG. 2 is obtained.

The present embodiment can provide a semiconductor device wherein semiconductor chip 7 has a surface provided with an external connection electrode and a surface opposite that with the external connection electrode, abrased to reduce semiconductor chip 7 in thickness to allow the chip itself to flex in response to bending-force. As such, when printed circuit board 9 with semiconductor chip 7 packaged thereon receives force and thus bends, together with printed circuit board 9 semiconductor chip 7 can accordingly bend to alleviate stress in solder ball 6 or a solder connection so as to prevent the solder connection from breaking.

Furthermore, applying resin of a low elastic modulus (a low Young's modulus) on the abrased surface of semiconductor chip 7, can reinforce thus-configured semiconductor chip 7 without affecting the bendability of the chip.

In the present invention a semiconductor chip has a surface provided with an electrode and a surface opposite that with the electrode, abrased to reduce the chip in thickness. As such, when the chip itself receives force exerted to bend it, together with the printed circuit board the semiconductor chip can accordingly bend to reduce stress in a solder connection to prevent the solder connection from being damaged. Furthermore, applying resin of a low elastic modulus on the abrased surface of the semiconductor chip can protect the chip to eliminate the risk of the semiconductor chip chipping or being scratched. As such, the semiconductor chip can be handled more readily. As a result, the entirety of the semiconductor device can be mechanically more reliable.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A semiconductor package comprising:
a printed circuit board; and
a semiconductor device, comprising:
a semiconductor substrate having a surface provided with an external connection electrode and mounted on the printed circuit board, and,
a surface opposite that with said external connection electrode, abrased to a mirror finish and reinforced with a back-surface reinforcement member, the back-surface reinforcement member formed on said opposite surface to be substantially non-removable,
wherein the thickness of the semiconductor substrate enables the semiconductor substrate to be capable of bending by the same amount as the printed circuit board having an elastic modulus of 0.5 to $2.5 \times 10^{10}$ N/m$^2$.

2. The semiconductor device of claim 1, wherein said back-surface reinforcement member is formed of resin.

3. The semiconductor device of claim 2, wherein said resin is formed of a material having an elastic modulus of $1.5 \times 10^6$ N/m$^2$ to $5.0 \times 10^6$ N/m$^2$.

4. The semiconductor device of claim 2, wherein said resin is selected from the group consisting of resin of rubber type, resin of silicone type, resin of epoxy type, resin of polyimide type and resin of urethane type.

5. A method of manufacturing the semiconductor package of claim 1, comprising steps of:
abrasing to obtain a mirror finish on a surface of said semiconductor substrate opposite to the surface thereof having said external connection electrode;
applying resin on said mirror finished surface; and
mounting the semiconductor substrate to a printed circuit board,
wherein the mounted semiconductor substrate includes the resin.

6. The method of claim 5, further comprising the step of cutting said semiconductor substrate after the step of applying.

7. The method of claim 6, further comprising the step of previously grinding said surface to be abrased.

8. The method of claim 7, wherein in the step of applying, said resin is printed.

9. The method of claim 7, wherein in the step of applying, said resin is applied by spin-coating.

10. The method of claim 6, wherein in the step of applying, said resin is printed.

11. The method of claim 6, wherein in the step of applying, said resin is applied by spin-coating.

12. The method of claim 5, further comprising the step of previously grinding said surface to be abrased.

13. The method of claim 12, wherein in the step of applying, said resin is printed.

14. The method of claim 12, wherein in the step of applying, said resin is applied by spin-coating.

15. The method of claim 5, wherein in the step of applying, said resin is printed.

16. The method of claim 5, wherein in the step of applying, said resin is applied by spin-coating.

17. A method of manufacturing the semiconductor package of claim 1, comprising steps of:
providing a mirror finished surface on a first surface of said semiconductor substrate;
providing said external connection electrode on a second surface which is opposite to the first surface;
applying resin on the mirror finished surface; and
mounting the semiconductor substrate to a printed circuit board,
wherein the mounted semiconductor substrate includes the resin.

18. A semiconductor package comprising:
a printed circuit board; and
a semiconductor device, comprising:
a semiconductor substrate having a first surface with an external connection electrode and mounted on the printed circuit board;
a second surface which is a mirror finished surface opposite to said first surface; and
a back surface reinforcement member on said second surface which is mirror finished, the back surface reinforcement member formed on said second surface to be substantially non-removable,
wherein the thickness of the semiconductor substrate enables the semiconductor substrate to be capable of bending by the same amount as the printed circuit board having an elastic modulus of 0.5 to $2.5 \times 10^{10}$ N/m$^2$.

* * * * *